United States Patent
Kim

(10) Patent No.: US 7,423,473 B2
(45) Date of Patent: Sep. 9, 2008

(54) SEQUENTIAL TRACKING TEMPERATURE SENSORS AND METHODS

(75) Inventor: Yong-jun Kim, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 549 days.

(21) Appl. No.: 11/141,161

(22) Filed: May 31, 2005

(65) Prior Publication Data

US 2006/0098509 A1 May 11, 2006

(30) Foreign Application Priority Data

Nov. 10, 2004 (KR) .................. 10-2004-0091456

(51) Int. Cl.
*H01L 35/00* (2006.01)

(52) U.S. Cl. .................... 327/512; 327/513

(58) Field of Classification Search ........... 327/512, 327/513; 702/99, 130, 132
See application file for complete search history.

(56) References Cited

U.S. PATENT DOCUMENTS

| | | | |
|---|---|---|---|
| 4,395,139 A * | 7/1983 | Namiki et al. ............. 374/178 |
| 5,875,142 A | 2/1999 | Chevallier | |
| 6,281,760 B1 * | 8/2001 | Koelling et al. ............ 331/66 |
| 6,667,925 B2 * | 12/2003 | Kobayashi et al. ......... 365/211 |
| 6,934,645 B2 * | 8/2005 | Kim .......................... 702/64 |
| 6,937,087 B2 | 8/2005 | Sim et al. | |
| 7,107,178 B2 * | 9/2006 | Won et al. ................... 702/130 |
| 7,127,368 B2 * | 10/2006 | Choi ........................... 702/130 |
| 7,180,211 B2 * | 2/2007 | Sinha et al. ................. 307/651 |

FOREIGN PATENT DOCUMENTS

| | | |
|---|---|---|
| JP | 10-11157 A | 1/1998 |
| KR | 2000-0002015 A | 1/2000 |
| KR | 2003-0011395 A | 2/2003 |
| KR | 2003-0070687 A | 9/2003 |
| KR | 10-2004-0013885 A | 2/2004 |

OTHER PUBLICATIONS

Notice to Submit Response with English-language translation, KR Application No. 10-2004-0091456, Dec. 14, 2005.

* cited by examiner

*Primary Examiner*—N. Drew Richards
*Assistant Examiner*—Hai L. Nguyen
(74) *Attorney, Agent, or Firm*—Myers Bigel Sibley & Sajovec, P.A.

(57) ABSTRACT

Temperature detectors include a temperature sensor that is configured to generate temperature tracking signals that indicate that a detected temperature is above, below or in a temperature range that corresponds to a selected one of a series of temperature control signals that indicate a series of temperature ranges. A control circuit is configured to sequentially supply the selected one of the series of control signals to the temperature sensor in response to the temperature tracking signals. The series of temperature control signals may indicate a series of overlapping temperature ranges, such that the temperature detector has a hysteresis characteristic. Analogous methods also may be provided.

24 Claims, 7 Drawing Sheets

SEQUENTIAL TRACKING TEMPERATURE SENSORS AND METHODS

CROSS-REFERENCE TO RELATED APPLICATION

This U.S. non-provisional patent application claims priority under 35 U.S.C. §119 of Korean Patent Application 2004-0091456, filed on Nov. 10, 2004, the entire contents of which are hereby incorporated by reference.

FIELD OF THE INVENTION

The present invention relates to temperature sensing circuits and methods, and more particularly to temperature sensing circuits and methods that may be used to sense a temperature of a semiconductor integrated circuit.

BACKGROUND OF THE INVENTION

Generally, semiconductor devices have a temperature dependent characteristic. For example, in semiconductor devices comprised of Complementary Metal Oxide Semiconductor (CMOS) devices, the operational speed generally decreases as the temperature of the semiconductor device becomes high, and the consumed current generally increases as the temperature of the semiconductor device becomes low. Such a temperature characteristic may need to be considered for devices that need to perform a refresh operation, such as Dynamic Random Access Memory (DRAM) devices. Since a leakage current of a DRAM cell generally increases with an increase of the temperature of the DRAM, the time for which data is maintained may decrease. Accordingly, the timing of a refresh operation may change.

Portable electronic devices, such as pagers, cellular phones, music players, calculators, laptop computers, and PDAs, generally use direct current (DC) power. At least one battery is used as an energy source for supplying DC power. In such battery-operated systems, reducing power consumption generally is desirable. Particularly, when a battery-operated system is in a sleep mode for saving power, circuit components built in the system may be turned off. However, a DRAM installed in the system generally must continue to refresh data stored in a DRAM cell in order to preserve the DRAM cell data.

An attempt to reduce power required by a DRAM is to vary a refresh period according to a temperature of the DRAM. When a temperature area is divided into a plurality of subareas, and the refresh period is made longer (i.e., a frequency of a refresh clock is reduced) in a low temperature subarea than in other subareas, power consumption can be reduced. Hence, a temperature detector is often used to ascertain an internal temperature of a DRAM.

FIG. 1 is a circuit diagram of a conventional temperature detector 100. Referring to FIG. 1, the conventional temperature detector 100 includes a reference temperature provider 10, a plurality of branches 20, 30, and 40, PMOS transistors 51, 52, and 53, first comparators 61, 62, and 63, and second comparators 71, 72, and 73. The reference temperature provider 10 provides a reference temperature and outputs a reference temperature signal NOC0 via a comparator 60. The branches 20, 30, and 40 provide detected temperature signals. The first comparators 61, 62, and 63 compare the temperatures detected by the first, second, and third branches 20, 30, and 40 with the reference temperature to generate temperature detection signals NOC1, NOC2, and NOC3. The second comparators 71, 72, and 73 compare the reference temperature signal NOC0 with the temperature detection signals NOC1, NOC2, and NOC3, respectively, to generate output signals O1, O2, and O3, respectively. A refresh clock frequency of a DRAM can be varied in response to the output signals O1, O2, and O3 of the conventional temperature detector 100.

The temperature detector 100 provides detection temperature points set to a plurality of specific temperatures. For example, the first, second, and third branches 20, 30, and 40 may provide detection points (or trip points) of 45° C., 65° C., and 85° C., respectively. Since the temperature detector 100 may be very sensitive to a change of a semiconductor fabrication process, a temperature tuning operation may be performed in which a changed detection temperature point is tuned to a designed detection temperature point. To perform temperature trimming during the temperature tuning operation, a shifted temperature that is caused by a change of the semiconductor fabrication process generally is detected in advance.

The temperature trimming generally is performed in each of the branches 20, 30, and 40 on a wafer level. In other words, for each of the branches 20, 30, and 40 of the temperature detector 100, a search is made for a corresponding shifted temperature and a trimming operation is performed depending on the shifted temperature. Accordingly, it may take a long time to execute a trimming test. Particularly, as the number of branches used increases, the trimming test time may become longer. In addition, the branches 20, 30, and 40 may occupy a significantly large part of the entire area of a chip.

SUMMARY OF THE INVENTION

Temperature detectors according to exemplary embodiments of the present invention include a temperature sensor that is configured to generate temperature tracking signals that indicate that a detected temperature is above, below or in a temperature range that corresponds to a selected one of a series of temperature control signals that indicate a series of temperature ranges. A control circuit is configured to sequentially supply the selected one of the series of control signals to the temperature sensor in response to the temperature tracking signals. In some embodiments, the series of temperature control signals indicate a series of overlapping temperature ranges, such that the temperature detector has a hysteresis characteristic. Moreover, in some embodiments, the temperature detector is included in a DRAM chip and the DRAM chip is configured to adjust a DRAM refresh rate in accordance with the temperature control signals. Analogous method embodiments also may be provided.

Moreover, in some embodiments, the temperature sensor includes a temperature sensitive unit that is configured to compare the detected temperature to two other temperatures that are defined by the selected one of the series of temperature control signals, to generate detection temperature signals. A tracking signal generation unit is responsive to the detection temperature signals, to generate the temperature tracking signals that indicate that a detected temperature is above, below or in a temperature range that corresponds to a selected one of the series of temperature control signals. Analogous method embodiments also may be provided.

Temperature detectors according to other embodiments of the present invention include a temperature sensitive unit that is configured to generate first and second detection temperature signals in response to temperature control signals applied thereto. A tracking signal generation unit is configured to generate temperature tracking signals by comparing the first and second detection temperature signals with a reference temperature signal. A control circuit unit is configured to sequentially generate the temperature control signals in response to the temperature tracking signals. Analogous method embodiments also may be provided.

Temperature detecting methods according to other embodiments of the present invention periodically activate a sensing enable signal. A first detection temperature signal and a second detection temperature signal are generated in response to the sensing enable signal and a temperature control signal. Temperature tracking signals are generated by comparing the first detection temperature signal with a reference temperature signal, and the second detection temperature signal with the reference temperature signal. The temperature control signal is then incremented or decremented in response to the temperature control tracking signals. The above-described operations then can repeat, so that a reference temperature corresponding to the reference temperature signal is included between temperatures corresponding to the first and second detection temperature signals.

DETAILED DESCRIPTION OF THE INVENTION

The invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Moreover, each embodiment described and illustrated herein includes its complementary conductivity type embodiment as well. Like numbers refer to like elements throughout.

It will be understood that when an element is referred to as being "responsive", "connected" or "coupled" to another element, it can be directly responsive, connected or coupled to the other element or intervening elements may be present. In contrast, when an element is referred to as being "directly responsive", "directly connected" or "directly coupled" to another element, there are no intervening elements present. As used herein, the term "and/or" includes any and all combinations of one or more of the associated listed items and may be abbreviated as "/".

It will be understood that, although the terms first, second, etc. may be used herein to describe various elements, these elements should not be limited by these terms. These terms are only used to distinguish one element from another. For example, a first transistor could be termed a second transistor, and, similarly, a second transistor could be termed a first transistor without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Figure 1:
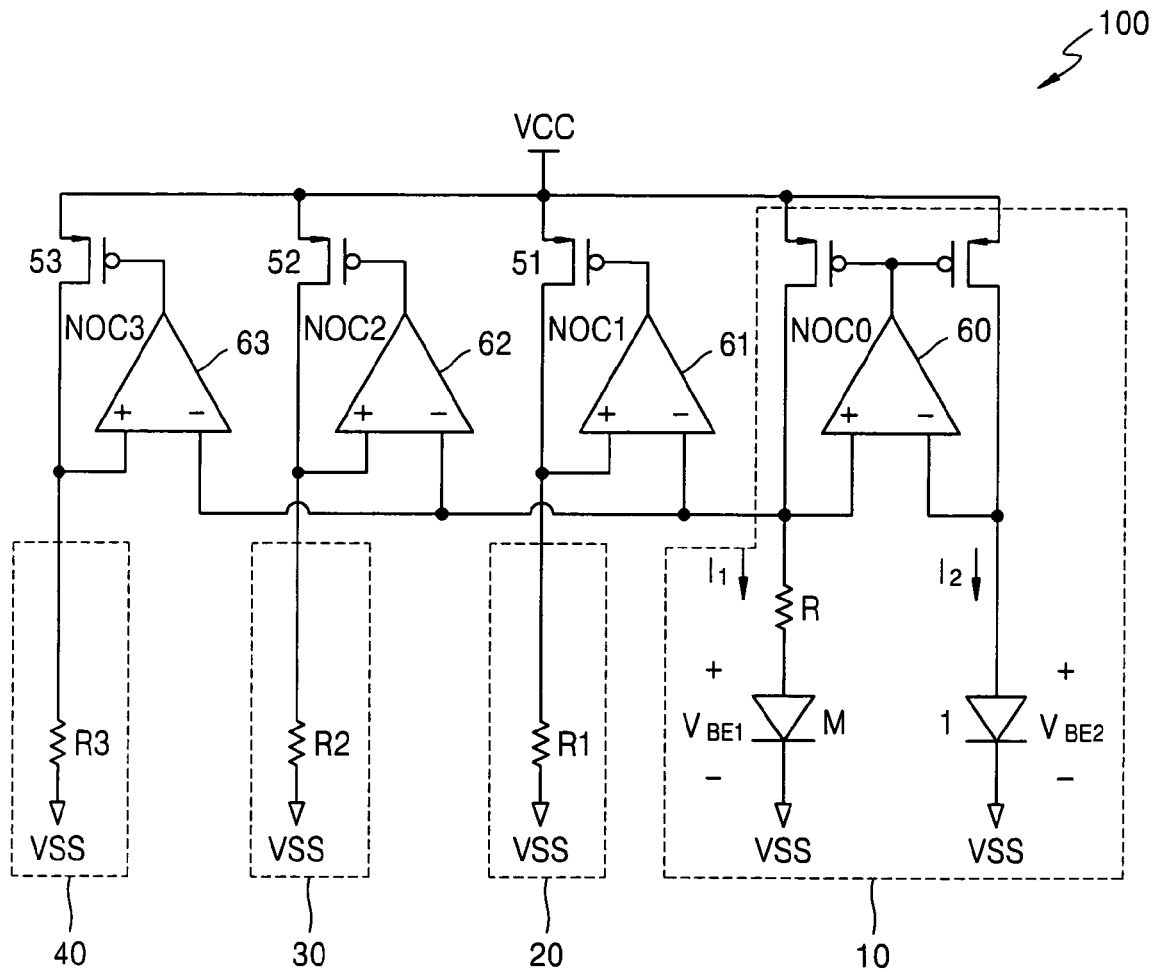
FIG. 1 is a circuit diagram of a conventional temperature sensor.
Figure 1:
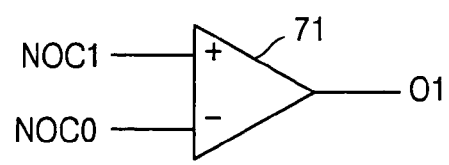
Figure 1:
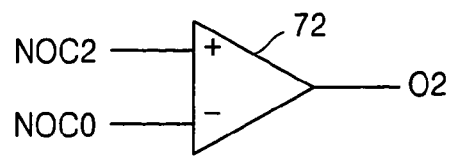
Figure 1:
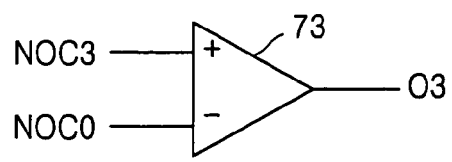
Figure 2:
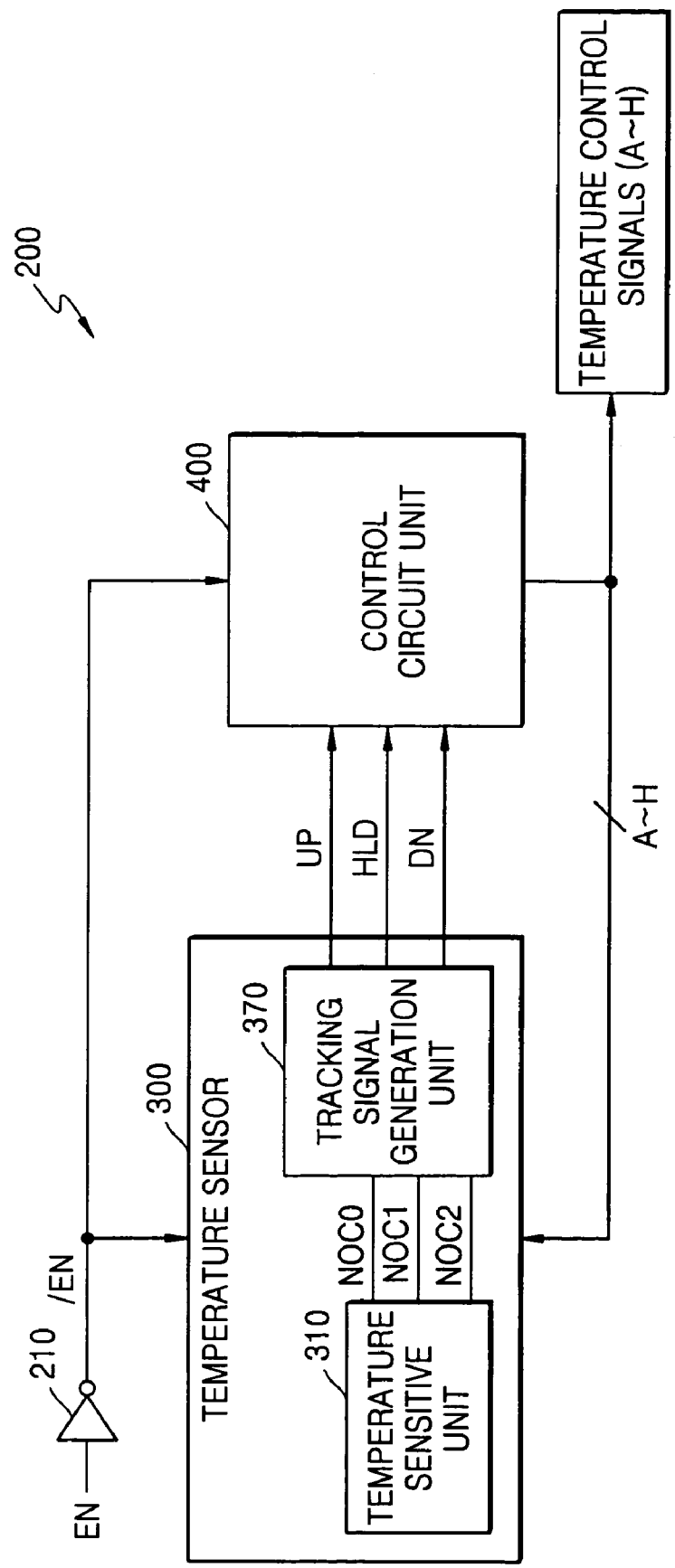
FIG. 2 is a block diagram of a temperature sensor according to exemplary embodiments of the present invention.

FIG. 2 is a block diagram of a temperature detector 200 according to exemplary embodiments of the present invention. Referring to FIG. 2, the temperature detector 200 includes an inverter 210, a temperature sensor 300, and a control circuit unit 400. The inverter 210 receives an enable signal EN and generates a sensing enable signal /EN. The temperature sensor 300 includes two branches, a temperature sensitive unit 310, and a tracking signal generation unit 370. The temperature sensitive unit 310 generates a reference temperature signal NOC0 and first and second detection temperature signals NOC1 and NOC2 in response to the sensing enable signal /EN and temperature control signals A-H. The tracking signal generation unit 370 generates temperature tracking signals UP, HLD, and DN in response to the sensing enable signal /EN. The control circuit unit 400 generates the temperature control signals A-H in response to the temperature tracking signals UP, HLD, and DN.

Figure 3:
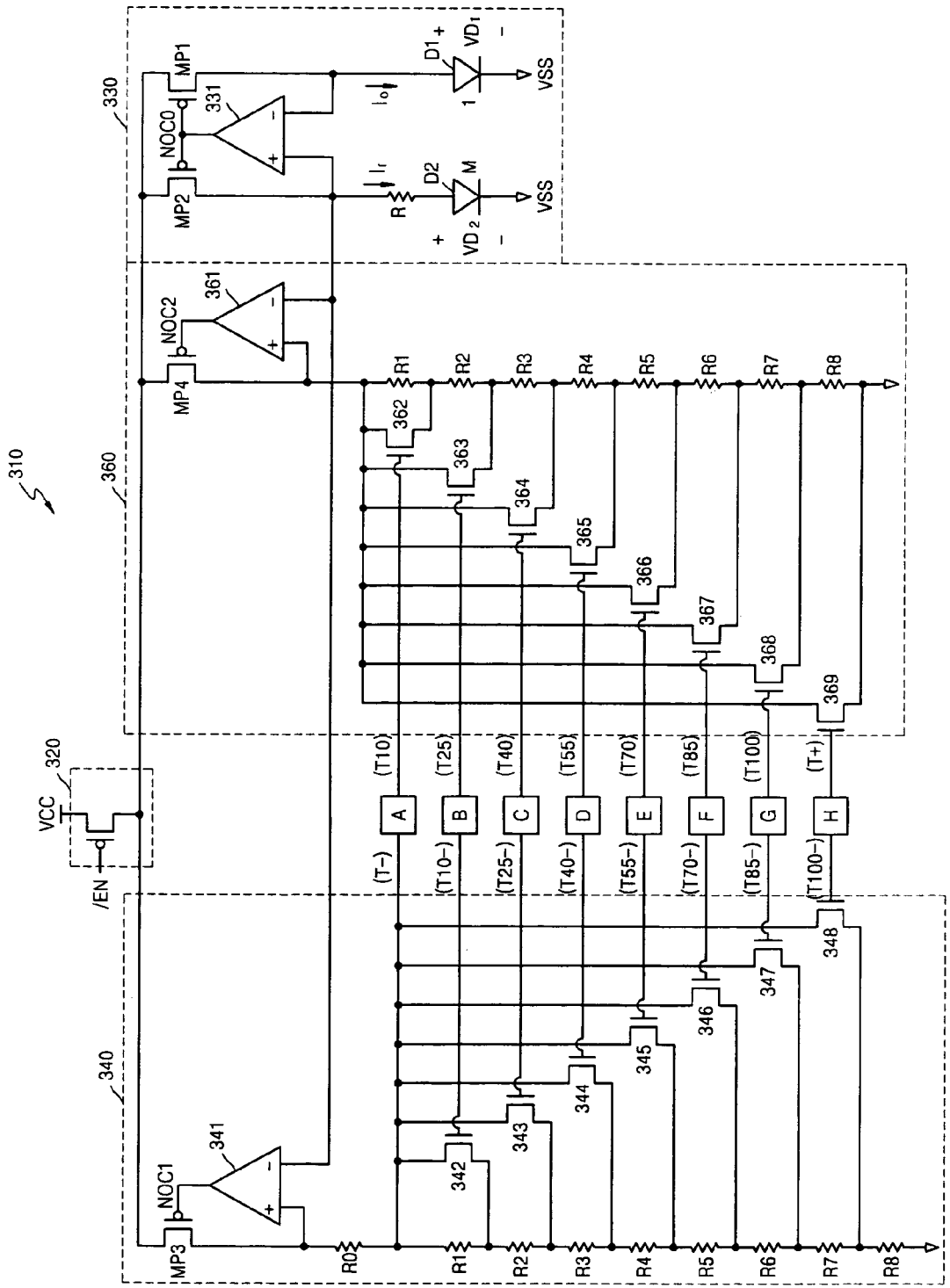
FIG. 3 is a circuit diagram of an exemplary temperature sensitive unit of FIG. 2.

FIG. 3 is a circuit diagram of an exemplary temperature sensitive unit 310, which includes a sensing enable unit 320, a reference temperature providing unit 330, and first and second branches 340 and 360. The sensing enable unit 320 supplies a supply voltage VCC to the temperature sensitive unit 310 in response to the sensing enable signal /EN.

The reference temperature providing unit 330 includes first and second PMOS transistors MP1 and MP2, a comparator 331, a resistor R, and first and second diodes D1 and D2. The first and second PMOS transistors MP1 and MP2 have the same channel length and the same channel width. The first and second diodes D1 and D2 have sizes at a ratio of 1:M.

Since gates of the first and second PMOS transistors MP1 and MP2 are connected to the comparator 331, and sources thereof are connected to the supply voltage VCC via the sensing enable unit 320, currents Ir and Io are the same. In otherwords, Io:Ir is 1:1.

A turn-on current ID of a diode is typically expressed as in Equation 1:

$$ID = Is \times (e^{VD/VT} - 1) \approx Is \times (e^{VD/VT}) \quad (1)$$

wherein Is denotes a reverse saturation current of the diode, VD denotes a diode voltage, and VT denotes a temperature voltage expressed in kT/q. Accordingly, the current Io flowing through the first diode D1 is expressed as in Equation 2:

$$I_O = I_S \times (e^{VD1/VT})  \quad (2)$$

wherein a first diode voltage VD1 is expressed as in Equation 3:

$$VD1 = VT \times \ln(Io/Is)  \quad (3)$$

A second diode voltage VD2 is expressed as in Equation 4:

$$VD2 = VT \times \ln(Ir/Is) = VT \times \ln(M \times Io/Is)  \quad (4)$$

Since the currents Io and Ir are the same, the first diode voltage VD1 is equal to a voltage level of the reference temperature signal NOC0. Accordingly, V(NOC0) is expressed as in Equation 5:

$$V(NOC0) = VD1 = VD2 + Ir \times R  \quad (5)$$

By substituting Equations 3 and 4 for Equation 5, Equation 6 is obtained:

$$VT \times \ln(Io/Is) = VT \times \ln(M \times Io/Is) + Ir \times R  \quad (6)$$

Hence, the current Ir is expressed as in Equation 7:

$$Ir = VT \times \ln(M)/R  \quad (7)$$

The current Ir is proportional to a temperature. In other words, the reference temperature providing unit 330 generates the reference temperature signal NOC0 having a voltage level proportional to a temperature of a semiconductor device in which the reference temperature providing unit 330 is placed. The reference temperature signal NOC0 denotes a signal corresponding to a present temperature of a semiconductor device.

The first branch 340 includes a third PMOS transistor MP3, a comparator 341, resistors R0 through R8, and first short-circuit switching transistors 342 through 348. The third PMOS transistor MP3 has a source connected to the sensing enable unit 320 and a gate to which an output of the comparator 341 is connected. The comparator 341 compares a voltage across a plurality of first resistors R1 through R8, which are selectively shorted, with a voltage of the reference temperature signal NOC0, to generate a first detection temperature signal NOC1. The first short-circuit switching transistors 342 through 348 selectively short first resistors R1-R8, which are connected in series, in response to the temperature control signals A-H. The first resistors R1 through R8 have identical resistances in some embodiments of the invention.

The second branch 360 includes a fourth PMOS transistor MP4, a comparator 361, and second short-circuit switching transistors 362 through 369. The fourth PMOS transistor MP4 has a source connected to the sensing enable unit 320 and a gate to which an output of the comparator 361 is connected. The comparator 361 compares voltages at second resistors R1-R8, which are selectively shorted, with the voltage of the reference temperature signal NOC0, to generate a second detection temperature signal NOC2. The second short-circuit switching transistors 362 through 369 selectively short the second resistors R1 through R8, which are connected in series, in response to the temperature control signals A-H. The second resistors R1 through R8 have identical resistances, in some embodiments of the invention, and are identical to the corresponding first resistors, in some embodiments of the invention.

The temperature control signals A-H are produced by the control circuit unit 400, which will be described later, and are selectively activated according to a predetermined temperature range of the semiconductor circuit. For example, the first through eighth temperature control signals A through H may be activated to a logic high when the temperature of the semiconductor circuit ranges below 10° C., between 10° C. and 25° C., between 25° C. and 40° C., between 40° C. and 55° C., between 55° C. and 70° C., between 70° C. and 85° C., between 85° C. and 100° C., and above 100° C., respectively.

Figure 4:
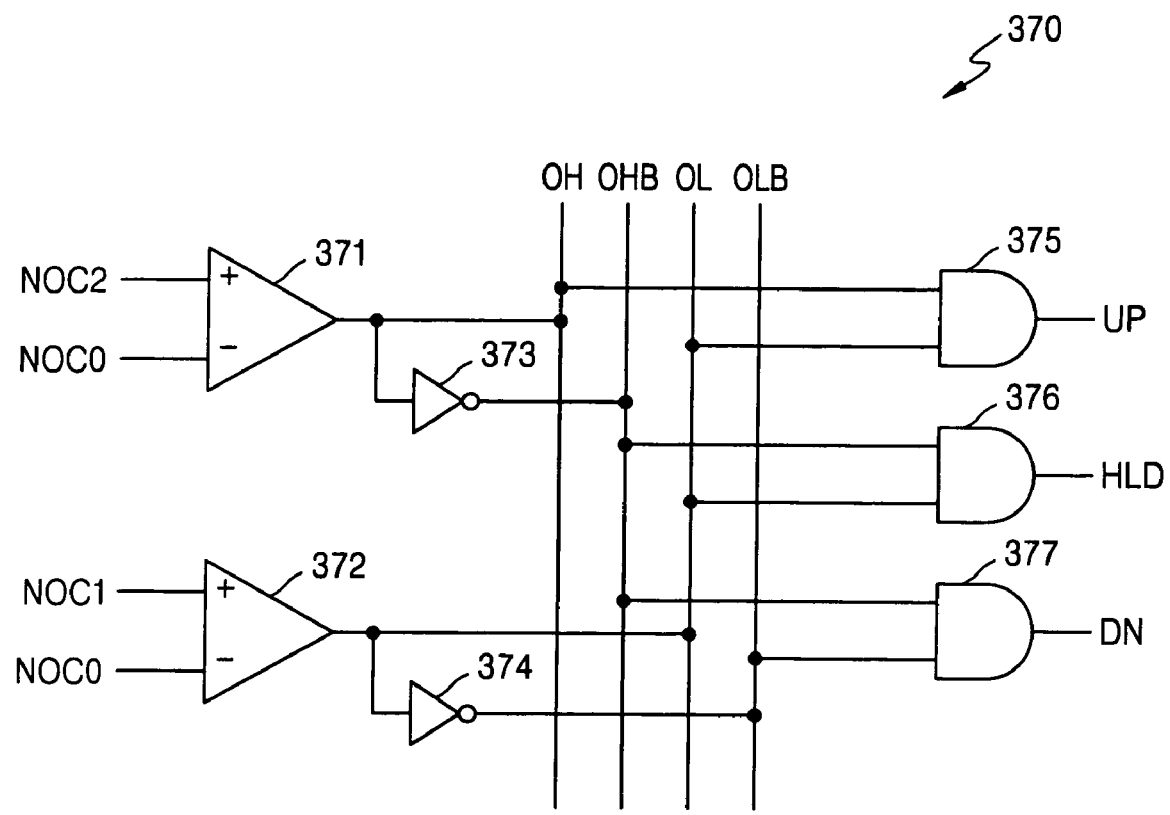
FIG. 4 is a circuit diagram of an exemplary tracking signal generation unit of FIG. 2.

The reference temperature signal NOC0 and the first and second detection temperature signals NOC1 and NOC2 are produced by the temperature sensitive unit 310 and provided to the tracking signal generation unit 370 of FIG. 4. Referring to FIG. 4, the tracking signal generation unit 370 includes a first comparator 371 which compares the reference temperature signal NOC0 with the second detection temperature signal NOC2, a second comparator 372 which compares the reference temperature signal NOC0 with the first detection temperature signal NOC1, a first inverter 373 which receives an output OH of the first comparator 371, a second inverter 374 which receives an output OL of the second comparator 372, a first AND gate 375 which receives the outputs OH and OL of the first and second comparators 371 and 372, a second AND gate 376 which receives an output OHB of the first inverter 373 and the output OL of the second comparator 372, and a third AND gate 377 which receives the output OHB of the first inverter 373 and an output OLB of the second inverter 374. An output of the first AND gate 375 is an up signal UP, an output of the second AND gate 376 is a hold signal HLD, and an output of the third AND gate 377 is a down signal DN.

An operation of the tracking signal generation unit 370 is as in Table 1.

TABLE 1

| OH | OL | Output |
| --- | --- | --- |
| H | H | UP |
| L | H | HLD |
| L | L | DN |

Figure 5:
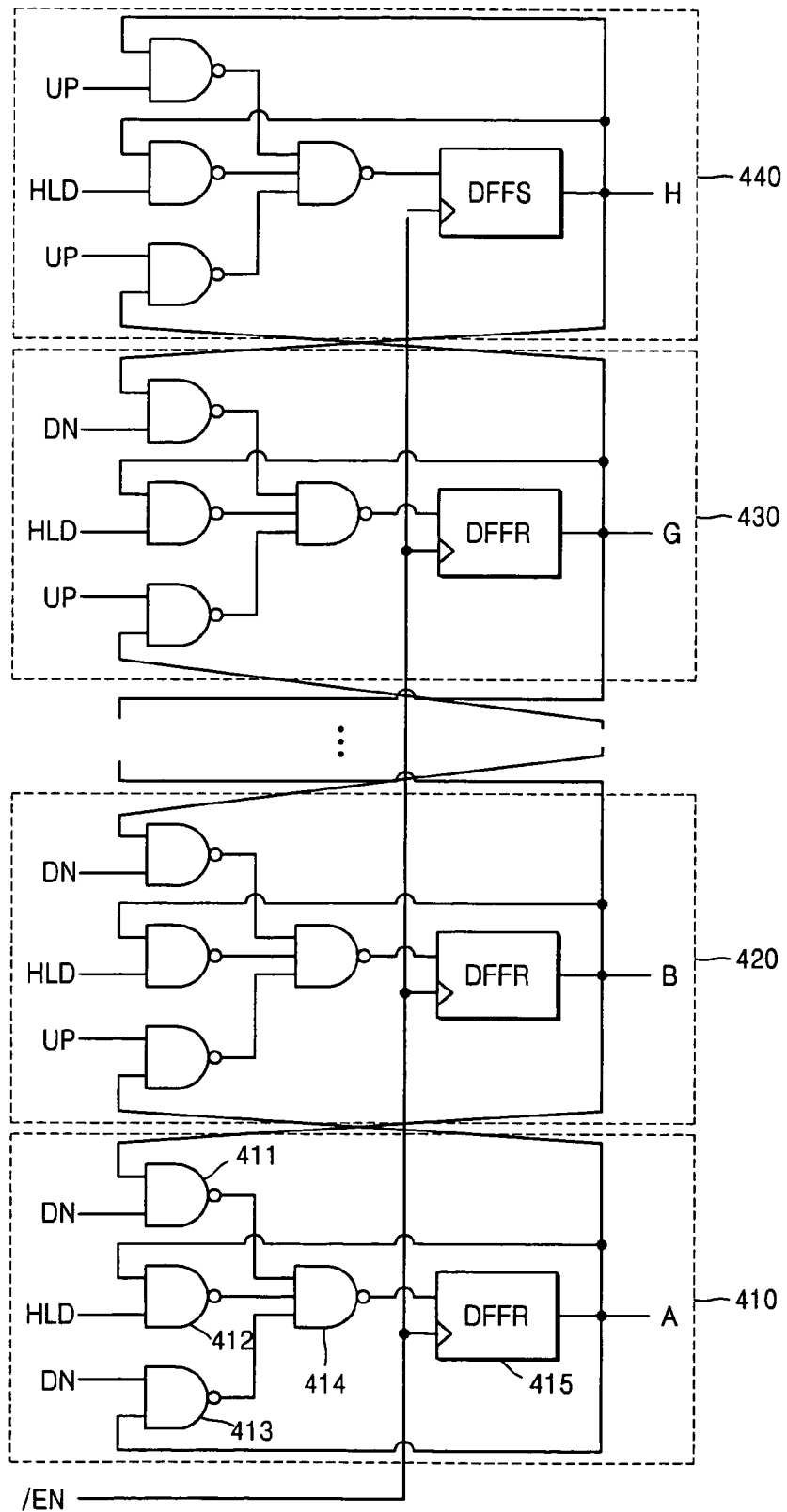
FIG. 5 is a circuit diagram of an exemplary control circuit unit of FIG. 2.

FIG. 5 is a circuit diagram of the control circuit unit 400 which receives temperature tracking signals, namely, the up signal UP, the hold signal HLD, and the down signal DN, and generates the temperature control signals A-H. Referring to FIG. 5, the control circuit unit 400 is comprised of a plurality of temperature control signal generators 410, 420, 430, and 440. The first temperature control signal generator 410 includes a first NAND gate 411, which receives the second temperature control signal B and the down signal DN, a second NAND gate 412, which receives the first temperature control signal A and the hold signal HLD, a third NAND gate 413, which receives the first temperature control signal A and the down signal DN, a fourth NAND gate 414, which receives outputs of the first, second, and third NAND gates 411, 412, and 413, and a D flip-flop 415, which outputs an output of the fourth NAND gate 414 as the first temperature control signal A in response to the sensing enable signal /EN. Since the other temperature control signal generators 420, 430, and 440 have almost the same structure as that of the first temperature control signal generator 410, a detailed description thereof will be omitted to avoid the duplication of explanation.

Figure 6:
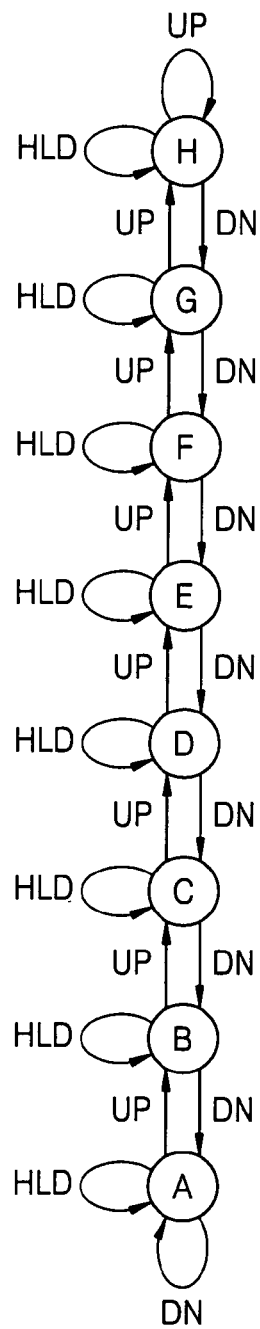
FIG. 6 illustrates a state diagram of an exemplary control circuit unit of FIG. 5.

The first through eighth temperature control signals A-H are generated one by one, in a sequence that is determined in response to the up signal UP, the hold signal HLD, and the down signal DN. This generation is illustrated in a state diagram of FIG. 6. Referring to FIG. 6, the first through eighth temperature control signals A-H are transferred from one to one (incremented) in a direction from A to H by the up signal UP. The first through eighth temperature control signals A-H are transferred from one to one (decremented) in a direction from H to A by the down signal DN. The first temperature control signal A is kept in its existing state by the down signal DN, and the eighth temperature control signal H is kept in its existing state by the up signal UP. The first through eighth temperature control signals A-H are kept in their existing states (not incremented or decremented) by the hold signal HLD.

Figure 7:
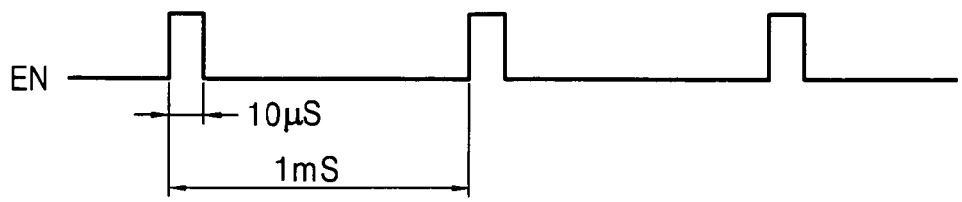
FIG. 7 is a timing diagram of an enable signal according to exemplary embodiments of the present invention.

In operations of the temperature sensitive unit 310, the tracking signal generation unit 370, and the control circuit unit 400, first, the enable signal EN is periodically generated. As shown in FIG. 7, in some embodiments, the enable signal EN has a logic high pulse of 10 us in width and 1 ms in cycle. It is assumed that a present temperature is 60° C. and the seventh temperature control signal G is activated to a logic high.

Since the first branch 340 of the temperature sensitive unit 310 senses a temperature of 85° C. in response to a first pulse of the enable signal EN and the seventh temperature control signal G, the first detection temperature signal NOC1 has a logic level lower than the reference temperature signal NOC0. Since the second branch 360 of the temperature sensitive unit 310 senses a temperature of 100° C., the second detection temperature signal NOC2 also has a logic level lower than the reference temperature signal NOC0. Hence, the outputs OH and OL of the first and second comparators 371 and 372 of the tracking signal generation unit 370 are logic low, so that the down signal DN is activated to a logic high. The seventh temperature control signal G is transferred (decremented) to the sixth temperature control signal F by the down signal DN, so that the sixth temperature control signal F is activated.

Thereafter, since the first and second branches 340 and 360 sense temperatures of 70° C. and 85° C., respectively, in response to a second pulse of the enable signal EN and the sixth temperature control signal F, the first and second detection temperature signals NOC1 and NOC2 have logic levels lower than the reference temperature signal NOC0. Hence, the outputs OH and OL of the first and second comparators 371 and 372 of the tracking signal generation unit 370 are logic low, so that the down signal DN is activated to a logic high. The sixth temperature control signal F is transferred (decremented) to the fifth temperature control signal E by the down signal DN, so that the fifth temperature control signal E is activated.

Then, since the first branch 340 of the temperature sensitive unit 310 senses a temperature of 55° C. in response to a third pulse of the enable signal EN and the fifth temperature control signal E, the first detection temperature signal NOC1 has a logic level higher than the reference temperature signal NOC0. Since the second branch 360 of the temperature sensitive unit 310 senses a temperature of 70° C., the second detection temperature signal NOC2 also has a logic level lower than the reference temperature signal NOC0. Hence, the outputs OH and OL of the first and second comparators 371 and 372 of the tracking signal generation unit 370 are logic low and logic high, respectively, so that the hold signal HLD is activated to a logic high. The fifth temperature control signal E is kept active by the hold signal HLD.

Hence, it can be seen from the fifth temperature control signal E that the present temperature of the semiconductor circuit ranges between 55° C. and 70° C. This means that the assumed present temperature, that is, 60° C., is properly detected.

Figure 8:
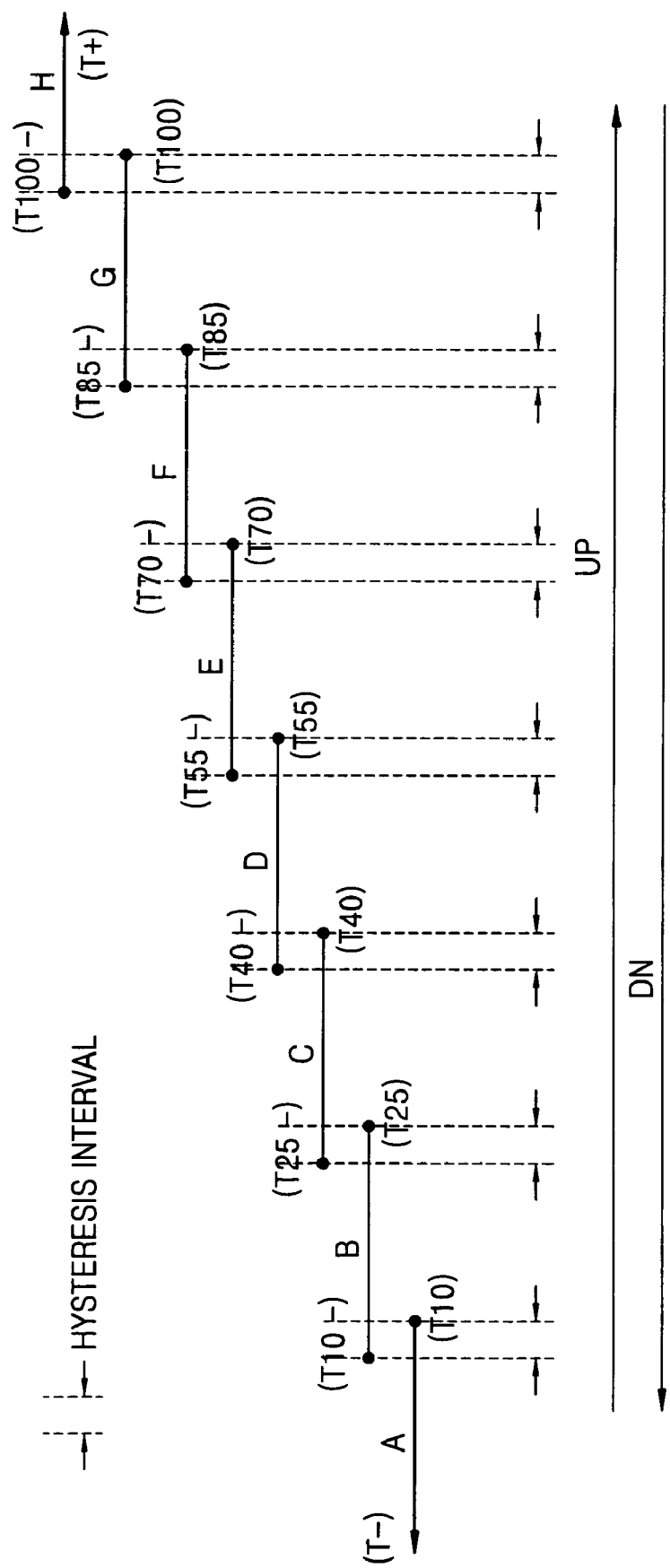
FIG. 8 illustrates hysteresis characteristics of a temperature sensor according to exemplary embodiments of the present invention.

FIG. 8 illustrates an exemplary temperature range where the temperature sensitive unit 310 of FIG. 3 operates. Referring to FIG. 8, the first through eighth temperature control signals A-H detect temperatures below 10° C., between 9° C. and 25° C., between 23° C. and 40° C., between 38° C. and 55° C., between 53° C. and 70° C., between 68° C. and 85° C., between 83° C. and 100° C., and above 98° C., respectively. In other words, temperature detection ranges of adjacent temperature control signals of the signals A-H are set to be overlapped by about 2° C. This hysteresis characteristic is adopted to reduce or prevent a malfunction from occurring when a detected temperature exists at the boundary between adjacent temperature control signals A-H.

Accordingly, in temperature detectors and temperature detecting methods according to exemplary embodiments of the invention, a hysteresis characteristic is adopted to reduce or prevent a malfunction from occurring when a detected temperature exists at the boundary between adjacent temperature control signals. Also, since detection temperatures may be generated using two branches in some embodiments of the invention, a chip size occupied by the temperature detector can be reduced or minimized.

In the drawings and specification, there have been disclosed embodiments of the invention and, although specific terms are employed, they are used in a generic and descriptive sense only and not for purposes of limitation, the scope of the invention being set forth in the following claims.

What is claimed is:

1. A temperature detector comprising:
   a temperature sensor that is configured to generate temperature tracking signals that indicate that a detected temperature is above, below, or in a temperature range that corresponds to a selected one of a series of temperature control signals that indicate a series of temperature ranges; and
   a control circuit unit that is configured to sequentially supply the selected one of the series of temperature control signals to the temperature sensor in response to the temperature tracking signals,
   wherein the series of temperature control signals indicate a series of overlapping temperature ranges, such that the temperature detector has a hysteresis characteristic.

2. The temperature detector of claim 1, wherein the temperature detector is included in a Dynamic Random Access Memory (DRAM) chip and wherein the DRAM chip is configured to adjust a DRAM refresh rate in accordance with the temperature control signals.

3. The temperature detector of claim 1, wherein the temperature sensor comprises:
   a temperature sensitive unit that is configured to compare the detected temperature to two other temperatures that are defined by the selected one of the series of temperature control signals to generate detection temperature signals; and
   a tracking signal generation unit that is responsive to the detection temperature signals to generate the temperature tracking signals that indicate that a detected temperature is above, below, or in a temperature range that corresponds to a selected one of a series of temperature control signals.

4. A temperature detector comprising:
   a temperature sensitive unit that is configured to generate first and second detection temperature signals in response to temperature control signals applied thereto;
   a tracking signal generation unit that is configured to generate temperature tracking signals by comparing the first and second detection temperature signals with a reference temperature signal; and a control circuit unit that is configured to sequentially generate the temperature control signals in response to the temperature tracking signals.

5. The temperature detector of claim 4, wherein the temperature detector is included in a Dynamic Random Access Memory (DRAM) chip and wherein the DRAM chip is configured to adjust a DRAM refresh rate in accordance with the temperature control signals.

6. The temperature detector of claim 4, wherein the temperature detector has a hysteresis characteristic in which a temperature range defined by one of the temperature control signals partially overlaps a temperature range defined by a next one of the temperature control signals.

7. The temperature detector of claim 4, wherein the temperature sensitive unit comprises:
   a sensing enable unit that is configured to supply a supply voltage to the temperature sensitive unit in response to a sensing enable signal;
   a reference temperature providing unit that is configured to provide the reference temperature signal;
   a first branch including a plurality of first resistors that are connected in series and that is configured to generate the first detection temperature signal using first short-circuit switching transistors to selectively short-circuit the first resistors in response to the temperature control signals; and
   a second branch including a plurality of second resistors that are connected in series and that is configured to generate the second detection temperature signal using second short-circuit switching transistors to selectively short-circuit the second resistors in response to the temperature control signals.

8. The temperature detector of claim 7, wherein the sensing enable signal is periodically generated and has a predetermined pulse width.

9. The temperature detector of claim 7, wherein the sensing enable unit comprises a transistor having a source to which the supply voltage is connected, a gate through which the sensing enable signal is received and a drain connected to the reference temperature providing unit and the first and second branches.

10. The temperature detector of claim 7, wherein the reference temperature providing unit comprises:
    first and second PMOS transistors having sources connected to the sensing enable unit and a drain of the second PMOS transistor defining the reference temperature signal;
    a first diode connected between a drain of the first PMOS transistor and a ground voltage;
    a resistor having one end connected to the drain of the second PMOS transistor;
    a second diode connected between the other end of the resistor and the ground voltage; and
    a comparator that is configured to compare the drain voltage of the first PMOS transistor and the drain voltage of the second PMOS transistor and connected to the gates of the first and second PMOS transistors.

11. The temperature detector of claim 10, wherein a size ratio of the second diode to the first diode is M:1.

12. The temperature detector of claim 7, wherein the first branch comprises:
    a third PMOS transistor having a source connected to the sensing enable unit, and a drain to which the first detection temperature signal is connected;
    a comparator that is configured to compare the first detection temperature signal with the reference temperature signal and connected to the gate of the third PMOS transistor;
    a resistor connected to the first detection temperature signal;
    the plurality of first resistors serially connected to one another between the resistor and a ground voltage; and
    the first short-circuit switching transistors selectively short-circuiting the first resistors in response to the temperature control signals.

13. The temperature detector of claim 12, wherein the first short-circuit switching transistors comprise NMOS transistors connected between the first resistors, having gates through which the temperature control signals are received.

14. The temperature detector of claim 7, wherein the second branch comprises:
    a fourth PMOS transistor having a source connected to the sensing enable unit and a drain to which the second detection temperature signal is connected;
    a comparator that is configured to compare the second detection temperature signal with the reference temperature signal and connected to the gate of the fourth PMOS transistor;
    the plurality of second resistors serially connected to one another between the second detection temperature signal and a ground voltage; and
    the second short-circuit switching transistors selectively short-circuiting the second resistors in response to the temperature control signals.

15. The temperature detector of claim 14, wherein the second short-circuit switching transistors comprise NMOS transistors connected between the second resistors, having gates through which the temperature control signals are received.

16. The temperature detector of claim 4, wherein the tracking signal generation unit comprises:
    a first comparator that is configured to compare the reference temperature signal with the second detection temperature signal;
    a second comparator that is configured to compare the reference temperature signal with the first detection temperature signal;
    a first inverter that is configured to receive an output of the first comparator;
    a second inverter that is configured to receive an output of the second comparator;
    a first AND gate that is configured to receive the outputs of the first and second comparators and to generate an up signal;
    a second AND gate that is configured to receive an output of the first inverter and an output of second comparator and to generate a hold signal; and
    a third AND gate that is configured to receive an output of the first inverter and an output of the second inverter and to generate a down signal.

17. The temperature detector of claim 16, wherein the tracking signal generation unit generates the up signal that makes temperatures corresponding to the first and second detection temperature signals increase, the down signal that makes temperatures corresponding to the first and second detection temperature signals decrease, and the hold signal that makes temperatures corresponding to the first and second detection temperature signals remain constant.

18. The temperature detector of claim 16, wherein the control circuit unit comprises a plurality of temperature control signal generation units, a respective one of which comprises:
- a first NAND gate that is configured to receive a temperature control signal from a next signal generation unit and the down signal;
- a second NAND gate that is configured to receive a temperature control signal of the respective stage and the hold signal;
- a third NAND gate that is configured to receive the temperature control signal of the respective stage and the down signal;
- a fourth NAND gate that is configured to receive outputs of the first, second, and third NAND gates; and
- a D flip-flop that is configured to generate an output of the fourth NAND gate as the temperature control signal of the respective stage.

19. A temperature detecting method comprising:
periodically activating a sensing enable signal;
generating a first detection temperature signal and a second detection temperature signal in response to the sensing enable signal and a temperature control signal;
generating temperature tracking signals by comparing the first detection temperature signal with a reference temperature signal, and the second detection temperature signal with the reference temperature signal; and
incrementing or decrementing the temperature control signal in response to the temperature tracking signals;
wherein the above operations are repeatedly performed so that a reference temperature corresponding to the reference temperature signal is included between temperatures corresponding to the first and second detection temperature signals.

20. The temperature detecting method of claim 19, wherein the temperature tracking signals make temperatures corresponding to the first and second detection temperature signals increase, decrease, or remain constant.

21. The temperature detecting method of claim 19, wherein the temperature detector has a hysteresis characteristic in which a temperature range defined by one of the temperature control signals partially overlaps a next one of the temperature control signals.

22. A temperature detecting method comprising:
generating temperature tracking signals that indicate that a detected temperature is above, below, or in a temperature range that corresponds to a selected one of a series of temperature control signals that indicate a series of temperature ranges; and
sequentially supplying the selected one of the series of temperature control signals in response to the temperature tracking signals,
wherein the series of temperature control signals indicate a series of overlapping temperature ranges, such that the temperature detecting method has a hysteresis characteristic.

23. The temperature detecting method according to claim 22, wherein generating temperature tracking signals comprises:
comparing the detected temperature to two other temperatures that are defined by the selected one of the series of temperature control signals to generate detection temperature signals; and
generating the temperature tracking signals responsive to the detection temperature signals.

24. The temperature detecting method of claim 22, wherein the temperature detecting method is performed in a Dynamic Random Access Memory (DRAM) chip and wherein the method further comprises:
adjusting a DRAM refresh rate in accordance with the temperature control signals.

* * * * *